United States Patent
Yu et al.

(10) Patent No.: US 9,553,000 B2
(45) Date of Patent: Jan. 24, 2017

(54) INTERCONNECT STRUCTURE FOR WAFER LEVEL PACKAGE

(71) Applicant: Taiwan Semiconductor Manufacturing Company, Ltd., Hsin-Chu (TW)

(72) Inventors: Chen-Hua Yu, Hsin-Chu (TW); Jing-Cheng Lin, Chu Tung Zhen (TW); Nai-Wei Liu, Fengshan (TW); Jui-Pin Hung, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/981,204

(22) Filed: Dec. 28, 2015

(65) Prior Publication Data

US 2016/0118272 A1    Apr. 28, 2016

Related U.S. Application Data

(60) Division of application No. 14/448,356, filed on Jul. 31, 2014, now Pat. No. 9,230,902, which is a (Continued)

(51) Int. Cl.
*H01L 23/485* (2006.01)
*H01L 21/48* (2006.01)
(Continued)

(52) U.S. Cl.
CPC ......... *H01L 21/4853* (2013.01); *H01L 21/561* (2013.01); *H01L 21/565* (2013.01);
(Continued)

(58) Field of Classification Search
CPC ............... H01L 2924/00014; H01L 2924/014; H01L 2924/15311; H01L 2224/32225; H01L 2224/16225; H01L 24/12
See application file for complete search history.

(56) References Cited

U.S. PATENT DOCUMENTS 5,870,289 A * 2/1999 Tokuda ............... H01L 21/6835
174/260
5,902,686 A    5/1999  Mis
(Continued)

FOREIGN PATENT DOCUMENTS

CN    101584033 A    11/2009
CN    102347251 A    2/2012
(Continued)

*Primary Examiner* — Jaehwan Oh
(74) *Attorney, Agent, or Firm* — Slater Matsil, LLP

(57) ABSTRACT

A package includes a device die having a substrate. A molding compound contacts a sidewall of the substrate. A metal pad is over the substrate. A passivation layer has a portion covering an edge portion of the metal pad. A metal pillar is over and contacting the metal pad. A dielectric layer is over the passivation layer. A package material formed of a molding compound or a polymer is over the dielectric layer. The dielectric layer includes a bottom portion between the passivation layer and the package material, and a sidewall portion between a sidewall of the metal pillar and a sidewall of the package material. A polymer layer is over the package material, the molding compound, and the metal pillar. A post-passivation interconnect (PPI) extends into the polymer layer. A solder ball is over the PPI, and is electrically coupled to the metal pad through the PPI.

20 Claims, 16 Drawing Sheets

Related U.S. Application Data continuation of application No. 13/170,973, filed on Jun. 28, 2011, now Pat. No. 8,829,676.

(51) Int. Cl.
   *H01L 21/56* (2006.01)
   *H01L 23/00* (2006.01)
   *H01L 21/78* (2006.01)
   *H01L 23/48* (2006.01)
   *H01L 23/498* (2006.01)
   *H01L 23/31* (2006.01)

(52) U.S. Cl.
   CPC .......... *H01L 21/568* (2013.01); *H01L 21/78* (2013.01); *H01L 23/481* (2013.01); *H01L 23/49838* (2013.01); *H01L 24/11* (2013.01); *H01L 24/13* (2013.01); *H01L 24/19* (2013.01); *H01L 24/97* (2013.01); *H01L 23/3128* (2013.01); *H01L 2224/0401* (2013.01); *H01L 2224/04105* (2013.01); *H01L 2224/05008* (2013.01); *H01L 2224/05569* (2013.01); *H01L 2224/05572* (2013.01); *H01L 2224/12105* (2013.01); *H01L 2224/131* (2013.01); *H01L 2224/13022* (2013.01); *H01L 2224/13025* (2013.01); *H01L 2224/13147* (2013.01); *H01L 2224/73267* (2013.01); *H01L 2224/96* (2013.01); *H01L 2924/00014* (2013.01); *H01L 2924/014* (2013.01); *H01L 2924/01029* (2013.01); *H01L 2924/0132* (2013.01); *H01L 2924/181* (2013.01)

(56) References Cited

U.S. PATENT DOCUMENTS

| | | | |
|---|---|---|---|
| 6,168,992 B1 | 1/2001 | Lee | |
| 6,433,427 B1* | 8/2002 | Wu | H01L 23/3114 257/737 |
| 6,515,369 B1* | 2/2003 | Lin | H01L 23/5222 257/724 |
| 6,528,349 B1* | 3/2003 | Patel | H01L 23/3114 257/E21.508 |
| 6,746,898 B2* | 6/2004 | Lin | H01L 23/36 257/E23.062 |
| 6,972,964 B2* | 12/2005 | Ho | H01L 23/5389 257/E23.178 |
| 7,170,162 B2* | 1/2007 | Chang | H01L 21/6835 257/700 |
| 7,276,783 B2* | 10/2007 | Goller | H01L 21/56 257/678 |
| 7,368,374 B2* | 5/2008 | Chia | H01L 23/3114 257/E23.021 |
| 7,397,000 B2* | 7/2008 | Shimoto | H01L 21/4857 174/258 |
| 7,485,956 B2* | 2/2009 | Tuckerman | H01L 23/06 257/704 |
| 7,498,196 B2* | 3/2009 | Lee | H01L 23/3114 438/106 |
| 7,749,886 B2 | 7/2010 | Oganesian et al. | |
| 7,755,151 B2* | 7/2010 | Lim | H03H 9/1092 257/416 |
| 7,863,721 B2* | 1/2011 | Suthiwongsunthorn | H01L 23/3114 257/686 |
| 7,883,991 B1 | 2/2011 | Wu et al. | |
| 7,906,860 B2* | 3/2011 | Meyer | H01L 21/561 257/723 |
| 8,003,512 B2* | 8/2011 | Belanger | H01L 24/11 438/612 |
| 8,008,125 B2* | 8/2011 | McConnelee | H01L 23/5383 257/686 |
| 8,039,315 B2* | 10/2011 | Lee | H01L 21/56 257/E21.499 |
| 8,114,708 B2* | 2/2012 | McConnelee | H01L 21/4857 257/678 |
| 8,163,596 B2 | 4/2012 | Kapusta et al. | |
| 8,178,435 B2* | 5/2012 | Lin | H01L 23/60 438/622 |
| 8,187,965 B2* | 5/2012 | Lin | H01L 23/5222 257/E21.476 |
| 8,216,881 B2* | 7/2012 | Beer | H01L 24/96 257/723 |
| 8,258,624 B2* | 9/2012 | Beer | H01L 24/96 257/693 |
| 8,361,842 B2 | 1/2013 | Yu et al. | |
| 8,373,272 B2* | 2/2013 | Liu | H01L 24/48 257/758 |
| 8,580,614 B2 | 11/2013 | Yu et al. | |
| 8,829,666 B2 | 9/2014 | Ng et al. | |
| 2001/0011764 A1 | 8/2001 | Elenius et al. | |
| 2002/0064922 A1* | 5/2002 | Lin | H01L 21/768 438/381 |
| 2002/0093107 A1* | 7/2002 | Wu | H01L 23/3114 257/780 |
| 2003/0017647 A1* | 1/2003 | Kwon | H01L 21/568 438/109 |
| 2003/0071326 A1* | 4/2003 | Lin | H01L 21/768 257/531 |
| 2003/0092274 A1* | 5/2003 | Brintzinger | H01L 24/03 438/694 |
| 2004/0232543 A1* | 11/2004 | Goller | H01L 21/56 257/700 |
| 2007/0170577 A1* | 7/2007 | Dangelmaier | H01L 22/32 257/693 |
| 2007/0236859 A1* | 10/2007 | Borland | C08G 59/621 361/272 |
| 2007/0267743 A1* | 11/2007 | Mizusawa | H01L 21/561 257/734 |
| 2007/0290379 A1* | 12/2007 | Dueber | C08G 73/1039 257/792 |
| 2007/0291440 A1* | 12/2007 | Dueber | H05K 1/162 361/301.3 |
| 2008/0150121 A1 | 6/2008 | Oganesian et al. | |
| 2009/0020864 A1* | 1/2009 | Pu | H01L 21/561 257/687 |
| 2009/0243081 A1* | 10/2009 | Kapusta | B81B 7/007 257/693 |
| 2009/0289356 A1* | 11/2009 | Camacho | H01L 21/6835 257/737 |
| 2009/0309235 A1* | 12/2009 | Suthiwongsunthorn | H01L 23/3114 257/777 |
| 2010/0193949 A1* | 8/2010 | Belanger | H01L 24/11 257/738 |
| 2010/0207265 A1 | 8/2010 | Muthukumar et al. | |
| 2010/0244240 A1 | 9/2010 | Kapusta et al. | |
| 2011/0198762 A1 | 8/2011 | Scanlan | |
| 2012/0028411 A1 | 2/2012 | Yu et al. | |
| 2012/0043654 A1* | 2/2012 | Lu | C25D 5/022 257/737 |
| 2012/0043655 A1* | 2/2012 | Khor | H01L 21/561 257/738 |
| 2012/0103475 A1* | 5/2012 | Kim | H01L 23/49827 148/276 |
| 2012/0119378 A1 | 5/2012 | Ng et al. | |
| 2013/0062760 A1 | 3/2013 | Hung et al. | |

FOREIGN PATENT DOCUMENTS

| | | |
|---|---|---|
| CN | 102468189 A | 5/2012 |
| JP | 2001521288 A | 11/2001 |
| KR | 20100047540 A | 5/2010 |
| KR | 20110077213 A | 7/2011 |

* cited by examiner

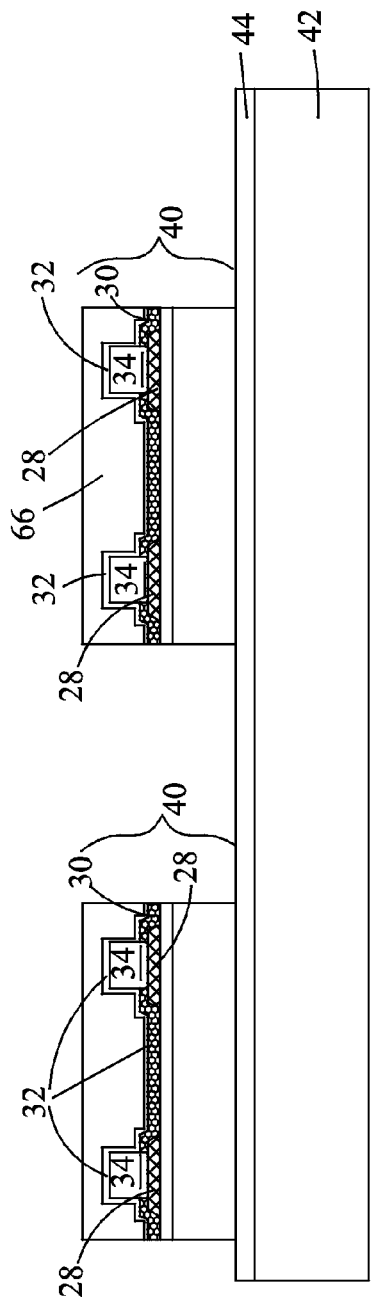
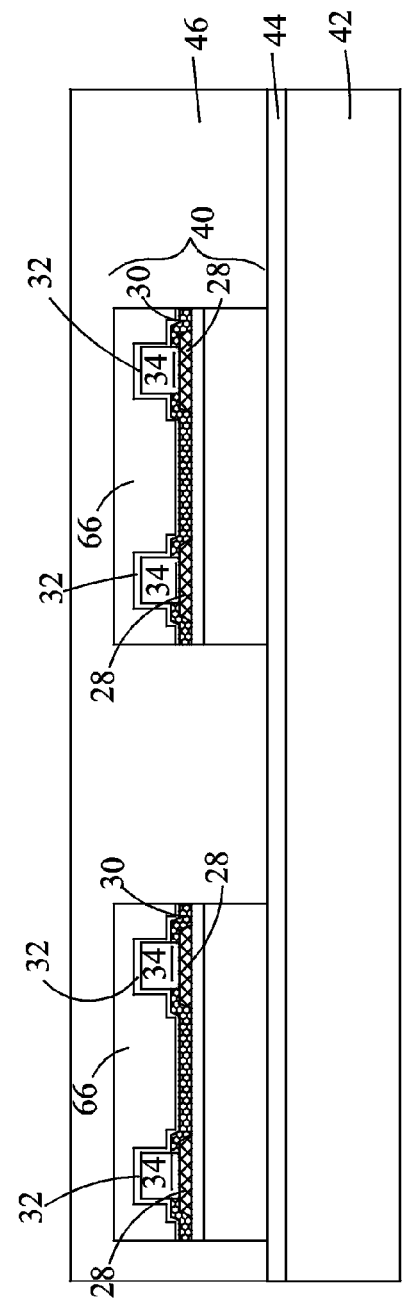
Fig. 8
Fig. 9

INTERCONNECT STRUCTURE FOR WAFER LEVEL PACKAGE

PRIORITY CLAIM AND CROSS-REFERENCE

This application is a divisional of U.S. application Ser. No. 14/448,356, filed on Jul. 31, 2014, entitled "Interconnect Structure for Wafer Level Package," which is a continuation of U.S. application Ser. No. 13/170,973, granted as U.S. Pat. No. 8,829,676 B2, filed on Jun. 28, 2011, entitled "Interconnect Structure for Wafer Level Package," which applications are incorporated by reference herein in their entireties.

BACKGROUND

With the evolving of semiconductor technologies, semiconductor dies are becoming increasingly smaller. More functions, however, need to be integrated into the semiconductor dies. Accordingly, the semiconductor dies need to have increasingly greater numbers of I/O pads packaged into smaller areas, and the density of the I/O pads rises quickly. As a result, the packaging of the semiconductor dies becomes more difficult, and adversely affecting the yield.

Package technologies can be divided into two categories. One category is typically referred to as wafer level package (WLP), wherein the dies on a wafer are packaged before they are sawed. The WLP technology has some advantageous features, such as a greater throughput and a lower cost. Further, less underfill or molding compound is needed. However, the WLP technology suffers from drawbacks. The conventional WLP can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged onto other wafers, and only "known-good-dies" are packaged. An advantageous feature of this packaging technology is the possibility of forming fan-out chip packages, which means the I/O pads on a die can be redistributed to a greater area than the die itself, and hence the number of I/O pads packed on the surfaces of the dies can be increased.

The formation of fan-out WLP faces challenges. For example, the formation of the fan-out WLP involves various materials whose characteristics have significant difference. Accordingly, the adhesion strength at the interfaces of these materials needs to be improved. The moisture isolation of the fan-out WLP needs to be improved. Furthermore, the inter-diffusion and out-gassing between the materials involved in the fan-out WLP need to be controlled.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 7 through 12 are cross-sectional views of intermediate stages in the manufacturing of a fan-out wafer level package (WLP) in accordance with an alternative embodiment, wherein a dielectric layer and a polyimide layer are formed over the metal pads of a device wafer before the device wafer is sawed, and wherein a via-first approach is used to package the dies sawed from the device wafer.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A fan-out wafer level package (WLP) structure and methods of forming the same are provided. The intermediate stages of manufacturing a WLP structure are illustrated in accordance with various embodiments. Throughout the various views and illustrative embodiments of the present invention, like reference numbers are used to designate like elements.

Figure 1:
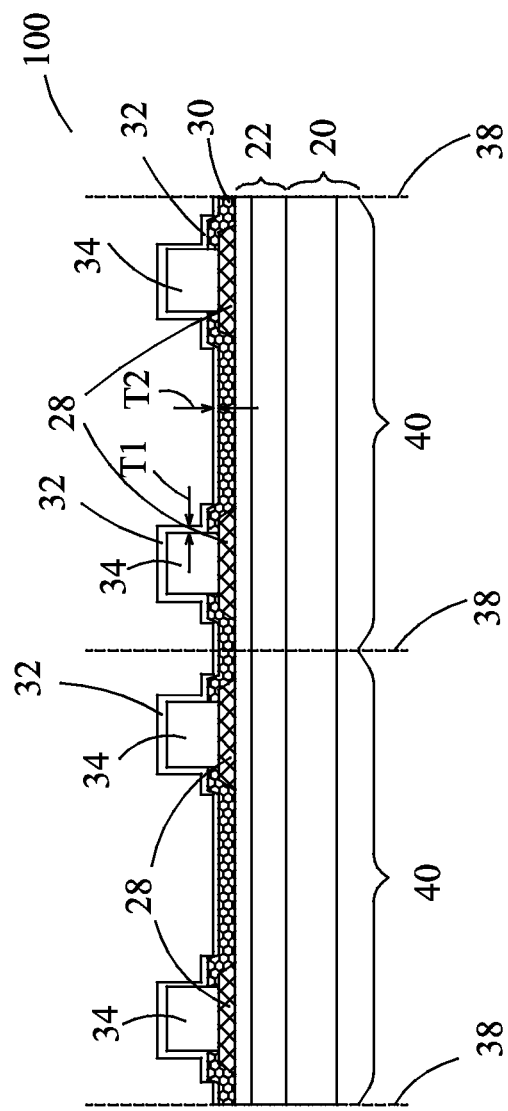
FIGS. 1 through 6 are cross-sectional views of intermediate stages in the manufacturing of a fan-out wafer level package (WLP) in accordance with an embodiment, wherein a dielectric layer is formed over the metal pads in a device wafer before the device wafer is sawed, and wherein a via-first approach is used to package the dies sawed from the device wafer.

Referring to FIG. 1, device wafer 100 is provided. Wafer 100 includes substrate 20, which may be a semiconductor substrate, such as a silicon substrate, although it may be formed of other semiconductor materials, such as silicon germanium, silicon carbon, gallium arsenide, or the like. Semiconductor devices (not shown), such as transistors, may be formed at the surface of substrate 20. Interconnect structure 22, which includes metal lines and vias (not shown) formed therein and electrically coupled to the semiconductor devices, is formed over substrate 20. The metal lines and vias may be formed of copper or copper alloys, and may be formed using damascene processes. Interconnect structure 22 may include an inter-layer dielectric (ILD) and inter-metal dielectrics (IMDs).

Metal pads 28 are formed over interconnect structure 22. Metal pads 28 may comprise aluminum (Al), copper (Cu), silver (Ag), gold (Au), nickel (Ni), tungsten (W), alloys thereof, and/or multi-layers thereof. In an exemplary embodiment, metal pads 28 are formed of aluminum copper. Metal pads 28 may be electrically coupled to the semiconductor devices, for example, through the underlying interconnect structure 22. Passivation layer 30 may be formed to cover the edge portions of metal pads 28. In an exemplary embodiment, passivation layer 30 is formed of a silicon oxide layer, and a silicon nitride layer over the silicon oxide layer, although other dielectric materials such as un-doped silicate glass (USG), silicon oxynitride, and the like, may be used.

Metal pillars 34 are formed over, and may be in physical contact with, metal pads 28. Metal pillars 34 extend into the openings in passivation layer 30, and the edges of metal pillars 34 may contact the edges of passivation layer 30. In an embodiment, metal pillars 34 comprise copper or copper alloys, although other metals or metal alloys may be used. The top surfaces of metal pillars 34 may be higher than the top surfaces of passivation layer 30, so that metal pillars 34 protrude over passivation layer 30.

Dielectric layer 32 is formed over passivation layer 30 and metal pillars 34. Dielectric layer 32 may have a bottom surface contacting the top surface of passivation layer 30, the top surfaces of metal pillars 34, and the sidewalls of metal pillars 34. The materials of dielectric layer 32 include, but are not limited to, silicon nitride, silicon carbide, silicon carbonitride, silicon oxycarbide, tetra-ethyl-ortho-silicate (TEOS) oxide, silicon oxide, multi-layers thereof, and/or combinations thereof. The thickness of dielectric layer 32 may be smaller than about 1 μm, and may be between about 0.1 μm and about 1 μm, for example, although different thicknesses may be used. Dielectric layer 32 may be substantially conformal, for example, with the thickness T1 of the vertical portions of dielectric layer 32 being close to thickness T2 of the horizontal portions. For example, thickness T1 may be between about 70 percent and 100 percent thickness T2. After the formation of dielectric layer 32, and without performing pattering to dielectric layer 32, device wafer 100 may be sawed along scribe lines 38, and hence device dies 40 are separated from wafer 100. At the time the die saw is performed, dielectric layer 32 may be the topmost layer that covers the entire wafer 100, and may be exposed to open air. Accordingly, dielectric layer 32 may prevent moisture from oxidizing and degrading metal pillars 34.

Figure 2:
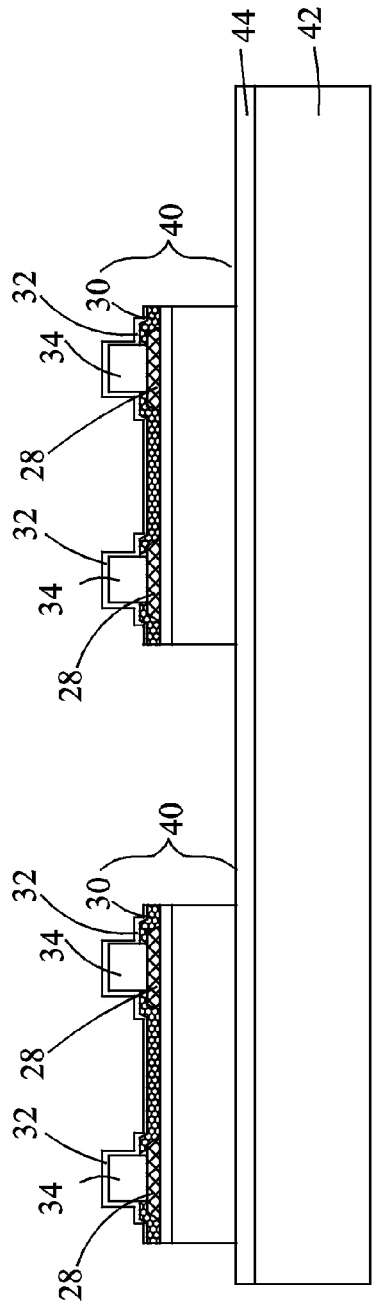
Figure 3:
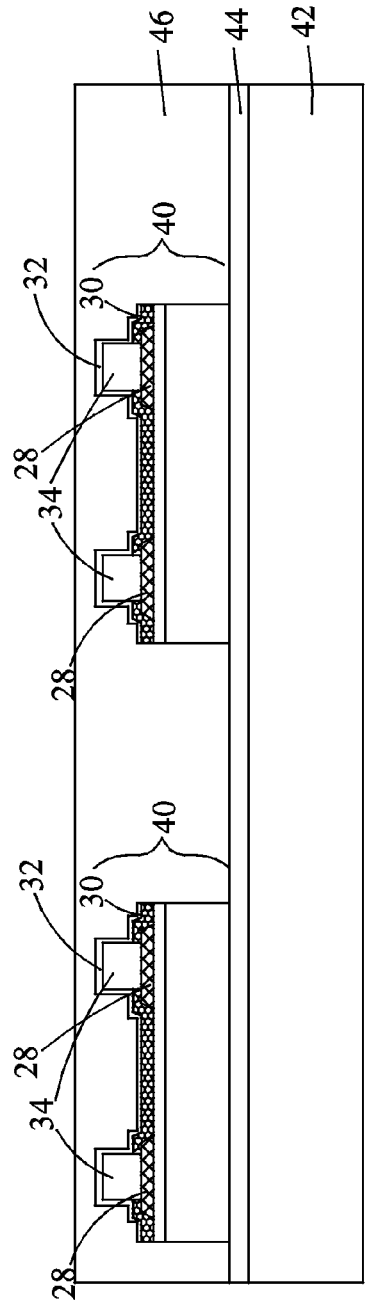

Next, as shown in FIG. 2, dies 40 are attached on carrier 42, for example, through adhesive 44. Referring to FIG. 3, molding compound 46 is applied to fill the gaps between dies 40, and to cover dies 40. In an embodiment, molding compound 46 contacts the sidewalls of substrate 20, the top surface and side edges of dielectric layer 32, and the side edges of passivation layer 30. The top surface of molding compound 46 may be higher than the top surfaces of dielectric layer 32. Molding compound 46 is then cured.

Figure 4:
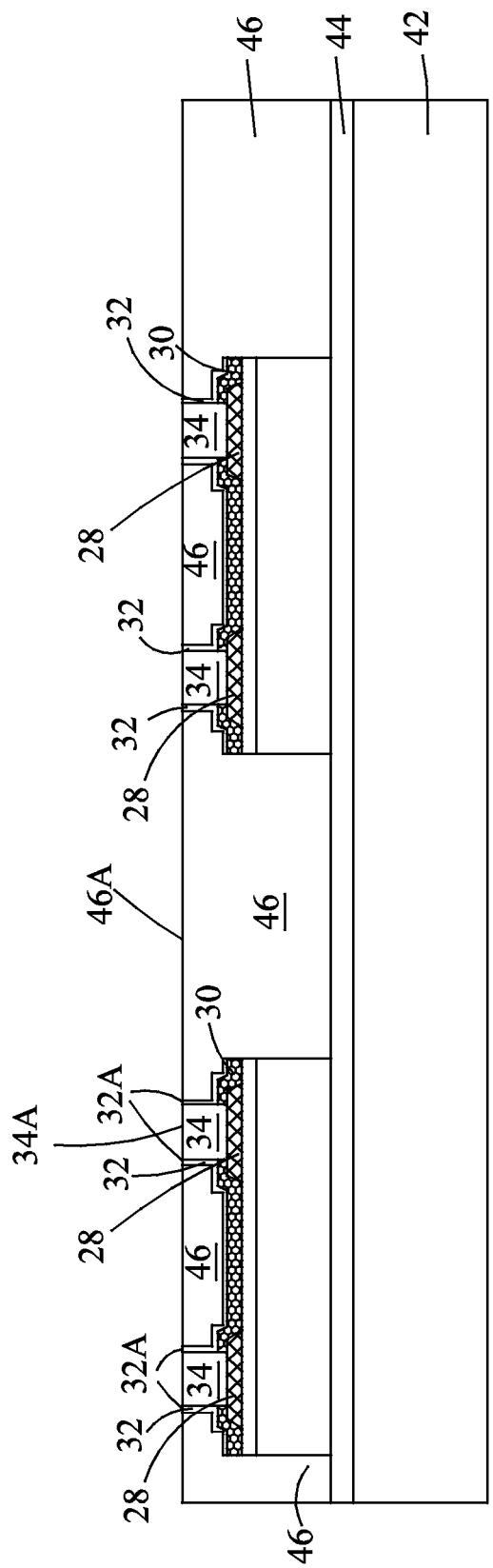
Figure 5:
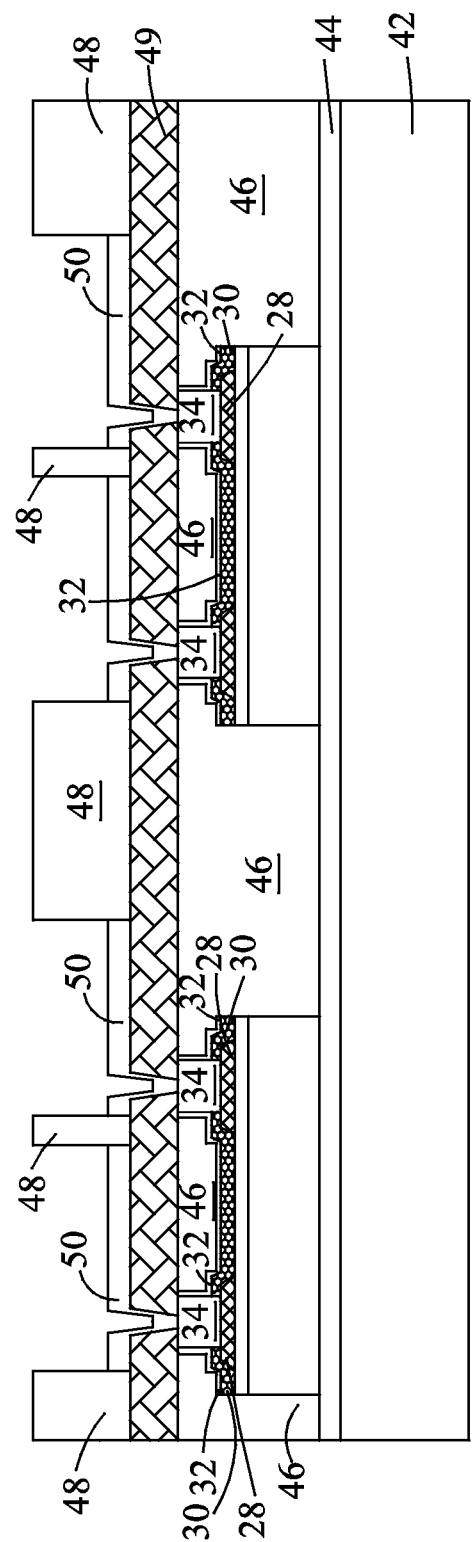

Next, as shown in FIG. 4, a grinding is performed, until the top surfaces of metal pillars 34 are exposed. Accordingly, the portions of dielectric layer 32 and molding compound 46 that are over the top surfaces of metal pillars 34 are removed. As a result of the grinding, top edges 32A of dielectric layer 32 are level with top surfaces 46A of molding compound 46, and are level with top surfaces 34A of metal pillars 34. FIG. 5 illustrates the formation of polymer layer 49 and post-passivation interconnects (PPIs) 50. Polymer layer 49 may be a polyimide layer, and hence is referred to as polyimide layer 49 throughout the description. Polyimide layer 49 may be formed of a photo-sensitive material, which can be patterned easily to form openings, through which the underlying metal pillars 34 are exposed. In an exemplary embodiment, polyimide layer 49 is formed of low-temperature polybenzoxazole (PBO). Mask layer 48 is then formed over polyimide layer 49. Mask layer 48 may be formed of a photo resist, and hence is alternatively referred to as photo resist 48 throughout the description, although other materials may be used. Next, a plating step is performed to form PPIs 50 in the openings in photo resist 48. PPIs 50 may be formed of copper or copper alloys, and may include PPI lines and PPI pads. PPIs 50 may extend into the openings in polyimide layer 49 to electrically connect to metal pillars 34. PPIs 50 may also be in contact with metal pillars 34.

Figure 6:
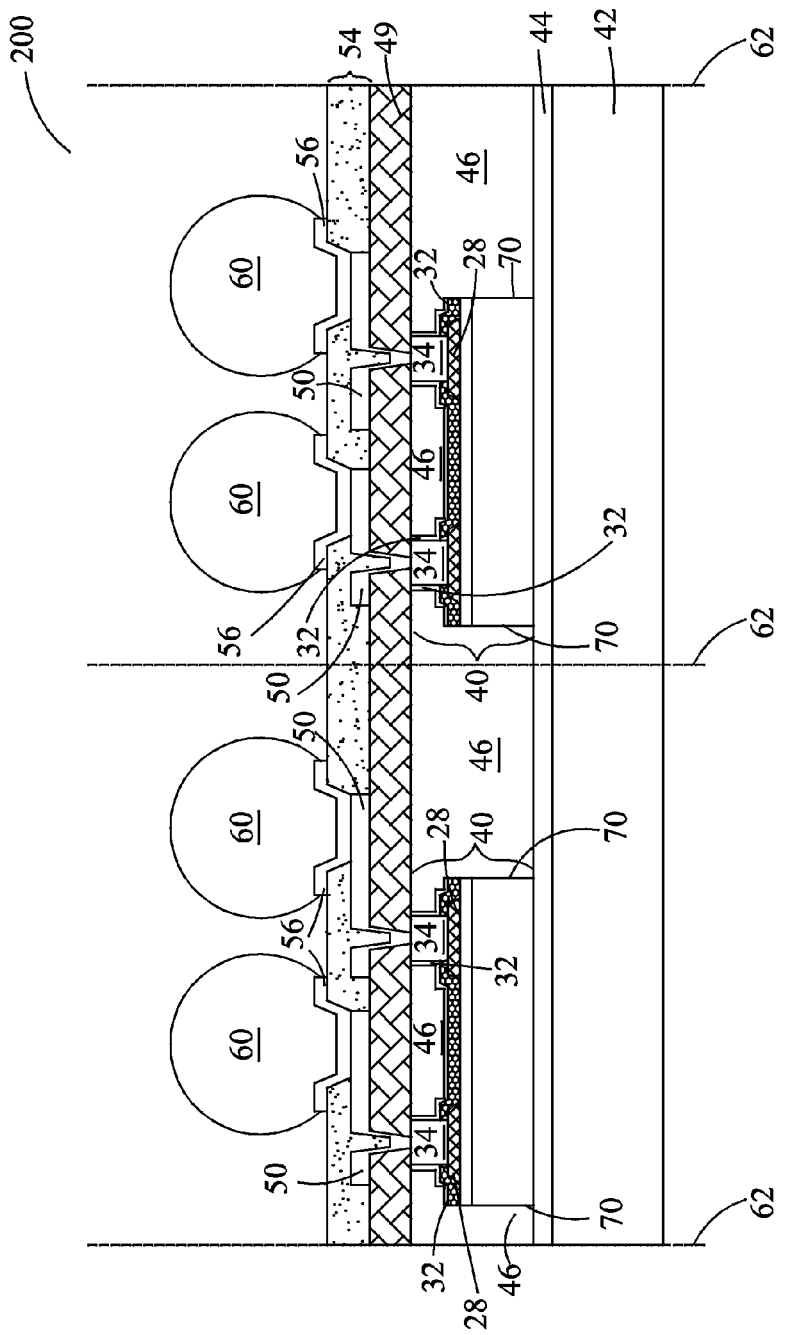
Figure 7:
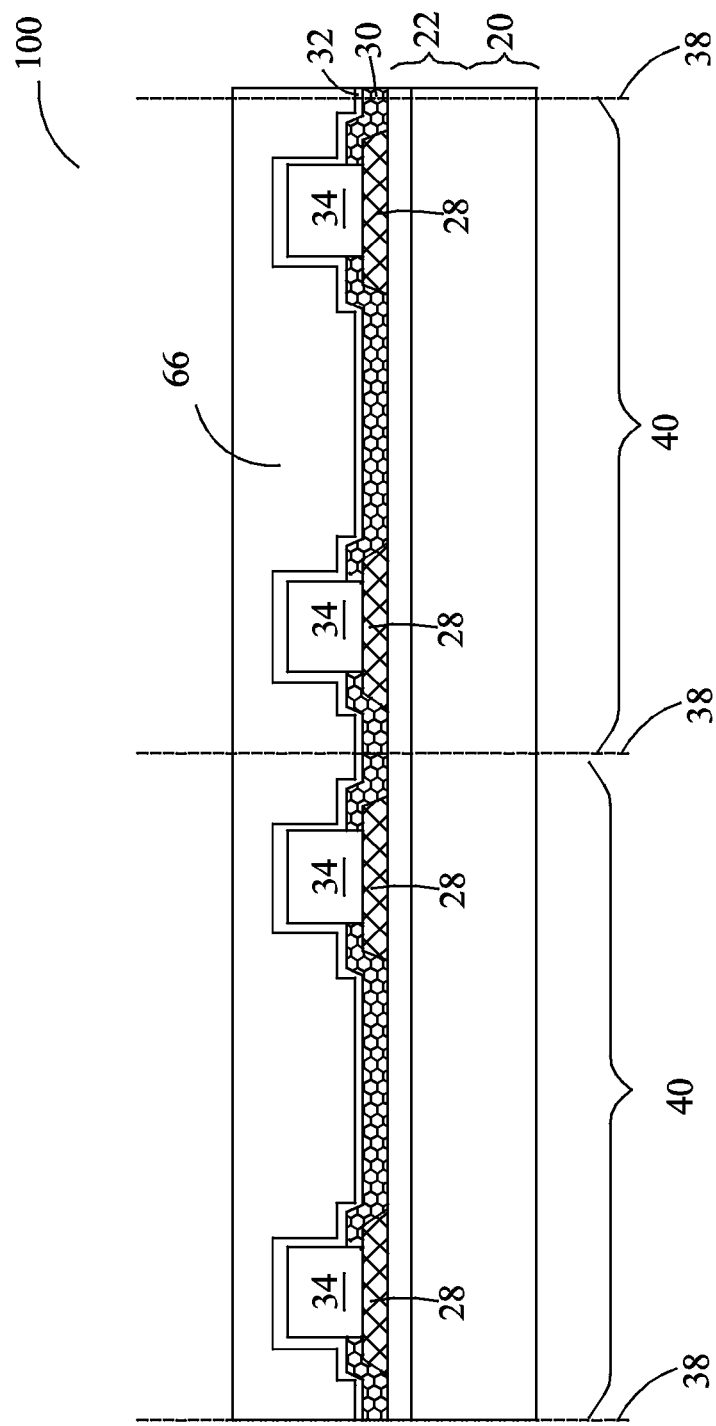

FIG. 6 illustrates the formation of polymer layer 54 (which may be a polyimide layer), under-bump metallurgies (UBMs) 56, and solder balls 60. In an embodiment, polyimide layer 54 is first applied and patterned, so that the PPI pads in PPIs 50 are exposed through the openings in polyimide layer 54. UBMs 56 may then be formed. Solder balls 60 are placed on UBMs 56 and reflowed. Fan-out wafer 200 is thus formed. Wafer 200 includes a plurality of dies 40 and the respective fan-out interconnects. Wafer 200 may be detached from carrier 42, and sawed into a plurality of dies, for example, along scribe lines 62. In the resulting fan-out WLP, dielectric layers 32 are formed on the sidewalls of metal pillars 34, and separate metal pillars 34 from molding compound 46. This may help reduce the diffusion of copper into molding compound 46, and reduce the out-gassing of molding compound 46 from degrading metal pillars 34. The side edges of dielectric layer 32 may be in contact with sidewalls 70 of molding compound 46.

FIGS. 7 through 12 illustrate cross-sectional views of intermediate stages in the manufacturing of a fan-out WLP in accordance with alternative embodiments. Unless specified otherwise, the reference numerals in the following provided alternative embodiments represent like elements in the embodiments illustrated in FIGS. 1 through 6. The initial steps of this embodiment are essentially the same as shown in FIG. 1, except that before wafer 100 is sawed into dies 40, polymer layer (which may be a polyimide layer) 66 is formed over dielectric layer 32. In an embodiment, polyimide layer 66 is formed of high-temperature PBO, although other polyimide materials can also be used. At the time device wafer 100 is sawed, polyimide layer 66 may be the topmost layer that blanket covers the entire device wafer 100. At the time device wafer 100 is sawed, polyimide layer 66 may be exposed to open air. After the sawing of wafer 100 into dies 40, each of dies 40 includes dielectric layer 32, and polyimide layer 66 over dielectric layer 32. Again, in some embodiments, no patterning is performed on polyimide layer 66 and dielectric layer 32 before the die saw.

Figure 10:
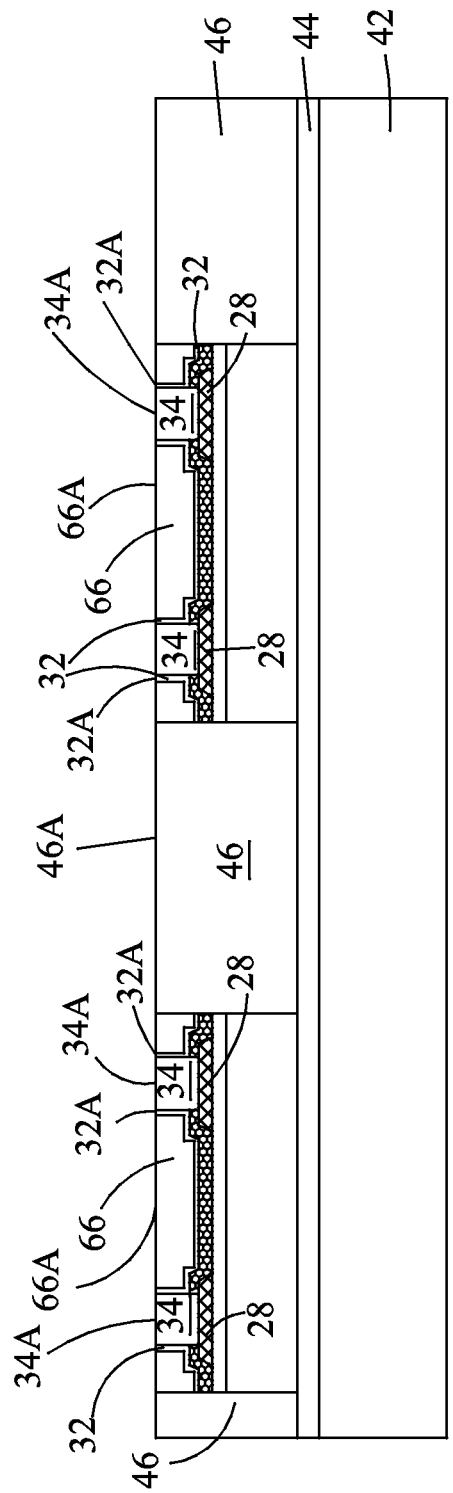
Figure 11:
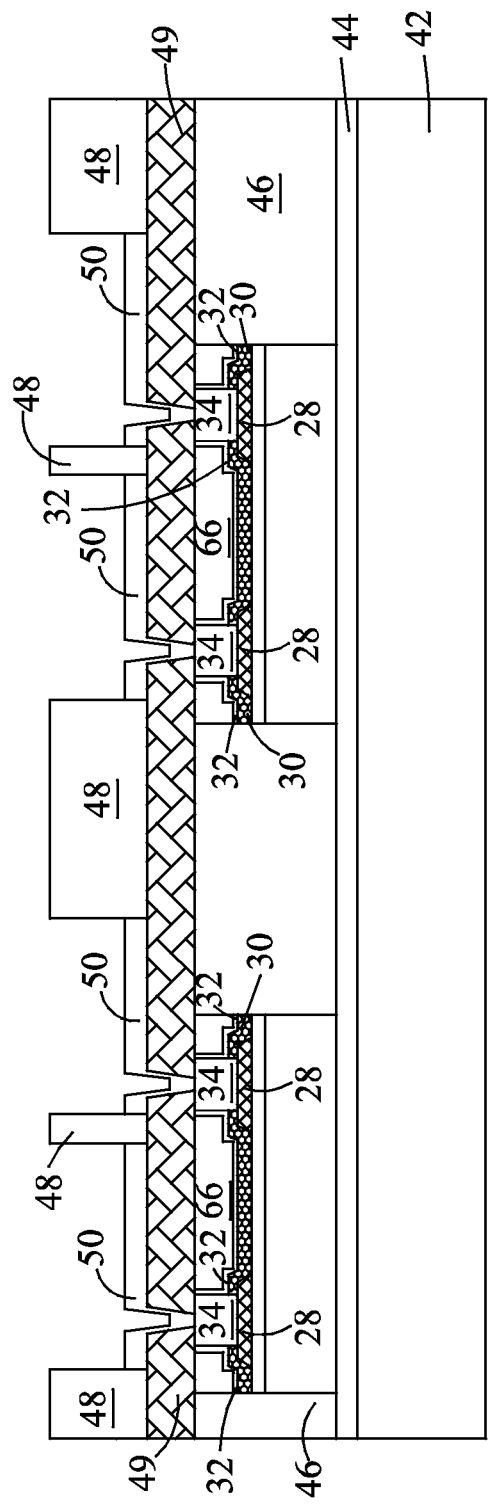
Figure 12:
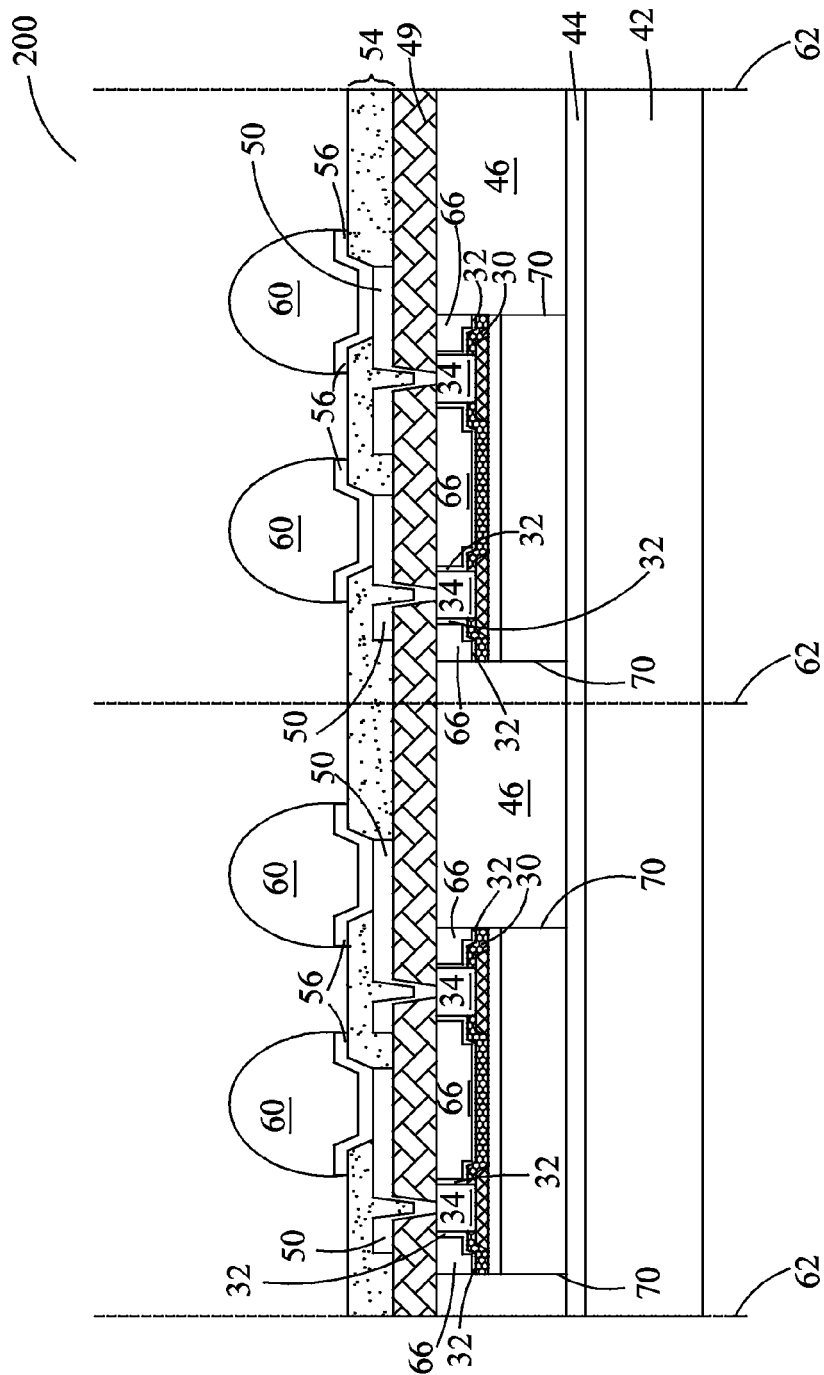

Next, as shown in FIG. 8, dies 40 are placed over and adhered to carrier 42, for example, through adhesive 44. Molding compound 46 is then filled into the gaps between dies 44, and further applied over polyimide layer 66, as shown in FIG. 9. Referring to FIG. 10, after the curing of molding compound 46, a grinding is performed to remove the top portion of molding compound 46, until metal pillars 34 are exposed. As a result, top edges 32A of dielectric layer 32 are level with top surface 46A of molding compound 46, top surfaces 34A of metal pillars 34, and top surfaces 66A of polyimide layer 66. In subsequent process steps, as shown in FIGS. 11 and 12, polymer layer 49, PPIs 50, UBMs 56, polymer layer 54, and solder balls 60 are formed. The formation steps may be essentially the same as shown in FIGS. 5 and 6. The resulting structure is shown in FIG. 12. The formation of fan-out wafer 200 is thus finished. Wafer 200 may then be detached from carrier 42. A die saw may be performed to saw wafer 200 into dies along scribe lines 62.

In the resulting fan-out WLP as shown in FIG. 12, dielectric layers 32 are formed on the sidewalls of metal pillars 34, and separate metal pillars 34 from polyimide layer 66. This may help reduce the inter-diffusion and out-gassing of copper between metal pillars 34 and polyimide layer 66. The structure shown in FIG. 12 differs from the structure in FIG. 6 in that polyimide layers 66, rather than molding compound 46 (with both referred to as package materials), are located directly over dielectric 32 and under polyimide layer 49. Furthermore, polyimide layers 66 are located between metal pillars 34, and are spaced apart from metal pillars 34 by the portions of dielectric layers 32 that are on the sidewalls of metal pillars 34. The side edges of polyimide layers 66, the side edges of passivation layer 30, and the side edges of dielectric layer 32 may be vertically aligned, and contacting, sidewalls 70 of molding compound 46.

Figure 13:
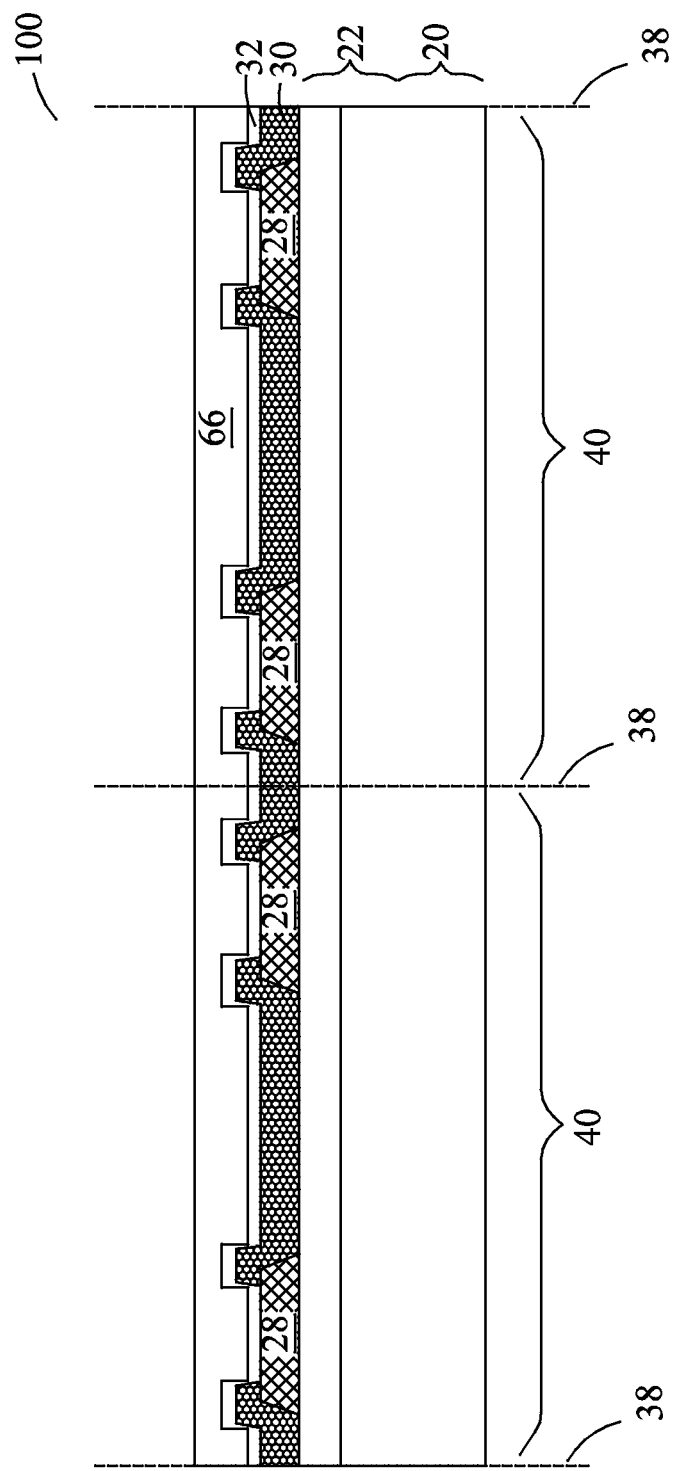
FIGS. 13 through 19 are cross-sectional views of intermediate stages in the manufacturing of a fan-out wafer level package (WLP) in accordance with an alternative embodiment, wherein a dielectric layer and a polyimide layer are formed over the metal pads of a device wafer before the device wafer is sawed, and wherein a via-last approach is used to package the dies sawed from the device wafer.

The embodiments as shown in FIGS. 1 through 12 are implemented using via-first approaches, in which metal pillars 34 (which act as vias, FIGS. 1 and 7) are formed before the die-saw processes. FIGS. 13 through 19 illustrate alternative embodiments adopting a via-last approach. Referring to FIG. 13, wafer 100 is formed. The structure as shown in FIG. 13 is similar to the structure shown in FIG. 7, except metal pillars 34 are not formed. Dielectric layer 32 is thus formed over passivation layer 30 and metal pads 28. The bottom surface of dielectric layer 32 may contact the top surface of passivation layer 30 and metal pads 28. Furthermore, dielectric layer 32 may extend into the openings in passivation layer 30 to contact metal pads 28. Polymer layer (which may be a polyimide layer) 66 is then formed over dielectric layer 32. In an embodiment, polyimide layer 66 contacts dielectric layer 32. Again, similar to the dielectric layer 32 in FIG. 1, dielectric layer 32 in FIG. 13 may be a conformal layer. Dielectric 32 has a better adhesion with metal pads 28 than polyimide layer 66, and hence may improve the adhesion between polyimide layer 66 and metal pads 28. Wafer 100 is sawed into dies 40 along scribe lines 38.

Figure 14:
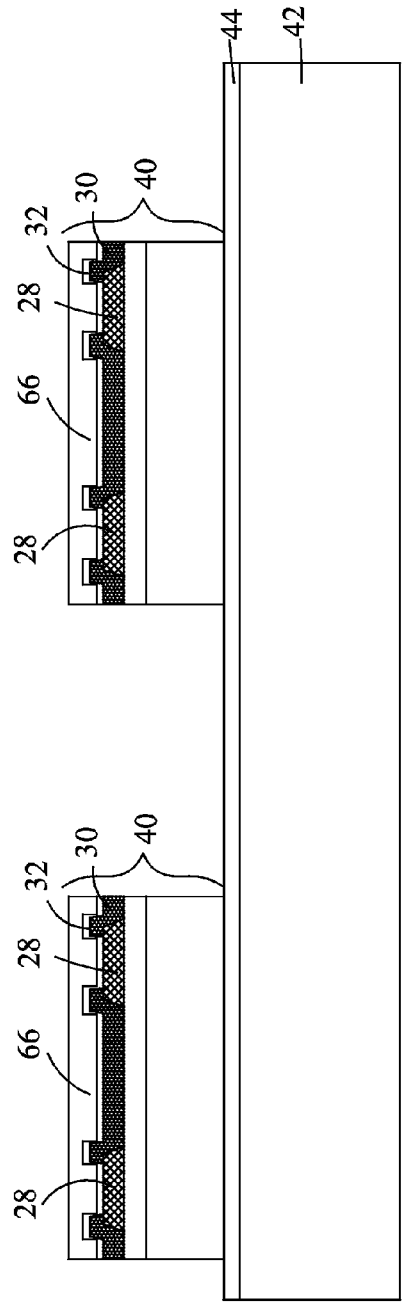
Figure 15:
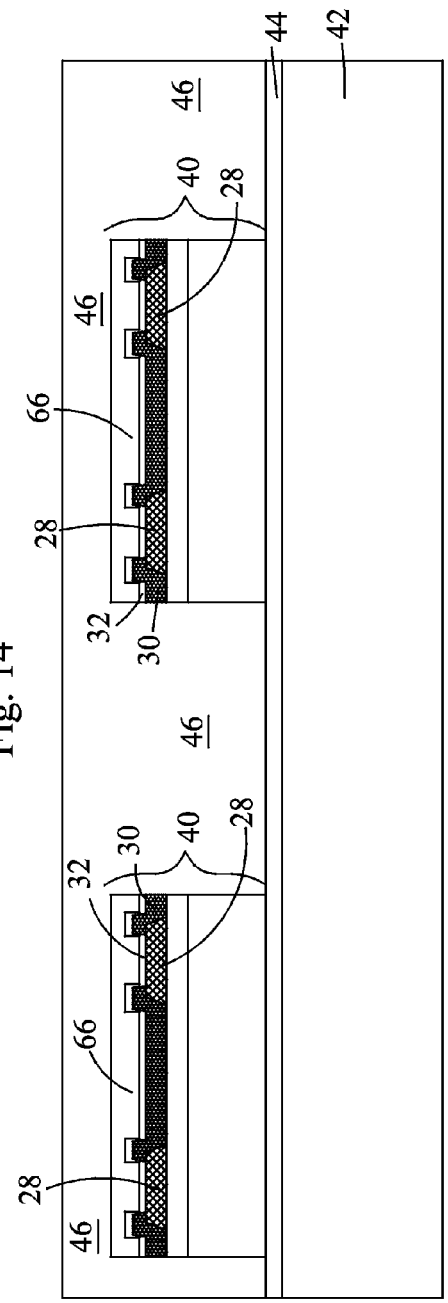
Figure 16:
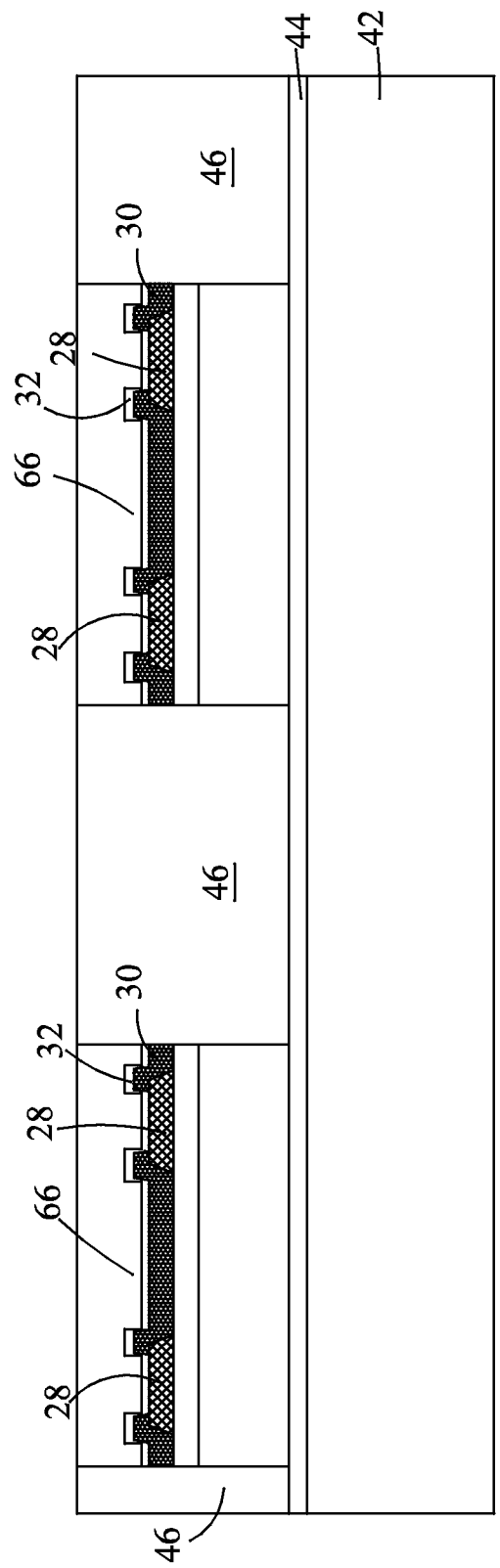
Figure 17:
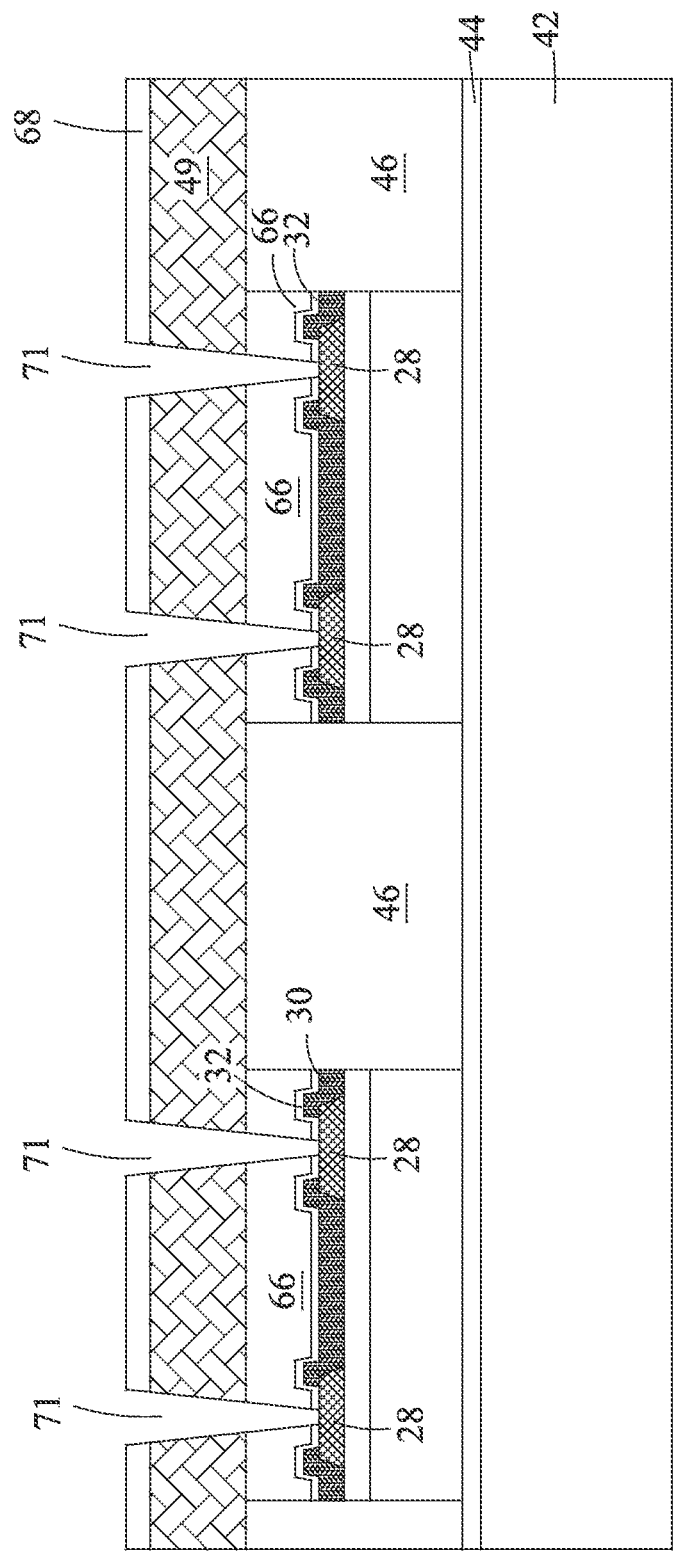

Referring to FIG. 14, dies 40 are attached to carrier 42. Next, as shown in FIG. 15, molding compound 46 is applied into the gaps between dies 40 and over dies 40. Furthermore, molding compound 46 may be applied over polyimide layers 66. FIG. 16 illustrates the grinding of molding compound 46. After the grinding, polyimide layers 66 are exposed, and the top surfaces of polyimide layers 66 are level with the top surface of molding compound 46. Referring to FIG. 17, polyimide layer 49 is formed over polyimide layer 66 and molding compound 46, followed by the formation of hard mask layer 68. In an embodiment, hard mask layer 68 is formed of silicon nitride, although other dielectric materials such as silicon carbide, silicon oxynitride, and the like, may also be used. Hard mask layer 68 is patterned (for example, by using a photo resist (not shown)). Polyimide layers 49 and 66 are then patterned using the patterned hard mask layer 68 to form openings 71. In the formation of openings 71, dielectric layer 32 may be used as an etch stop layer (ESL). The exposed portions of dielectric layer 32 are then etched, and metal pads 28 are exposed.

Figure 18:
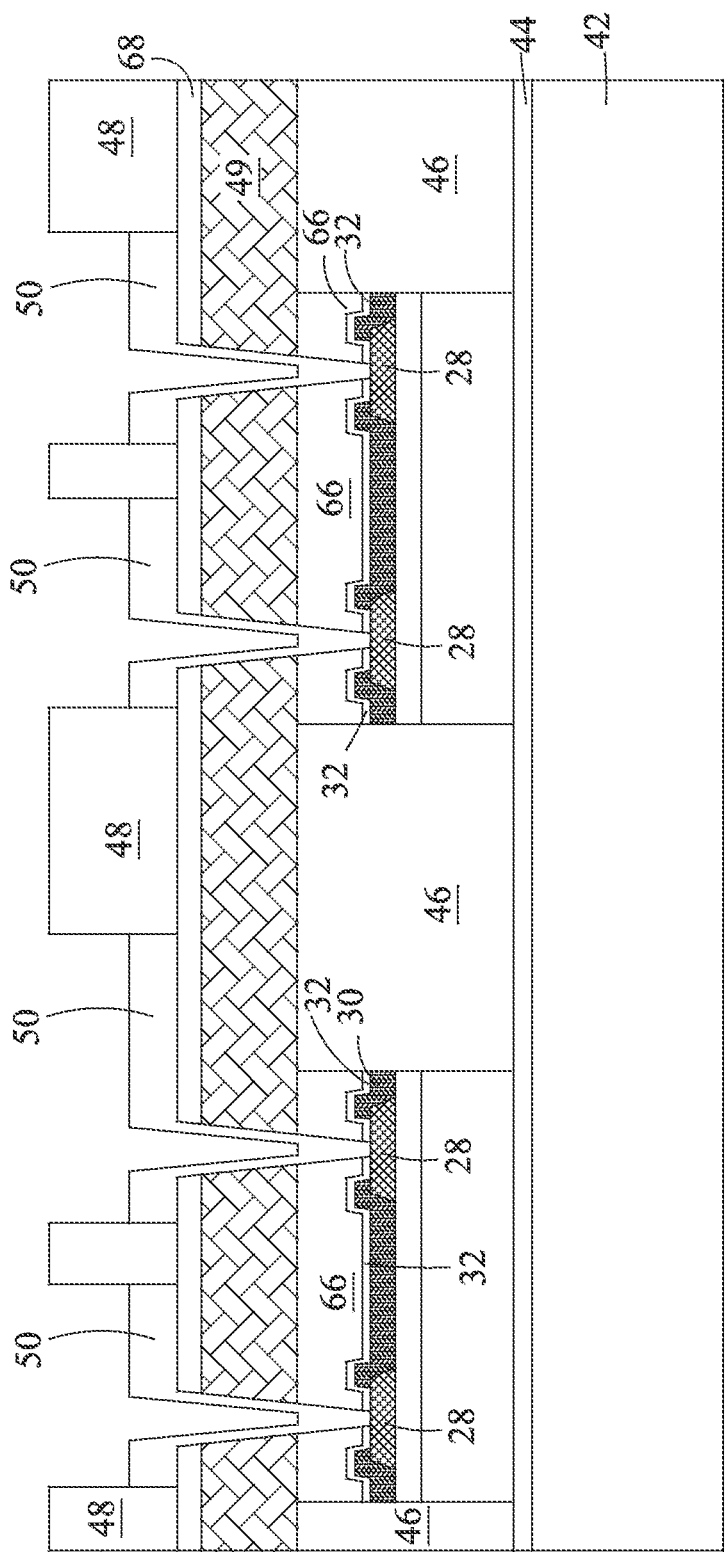
Figure 19:
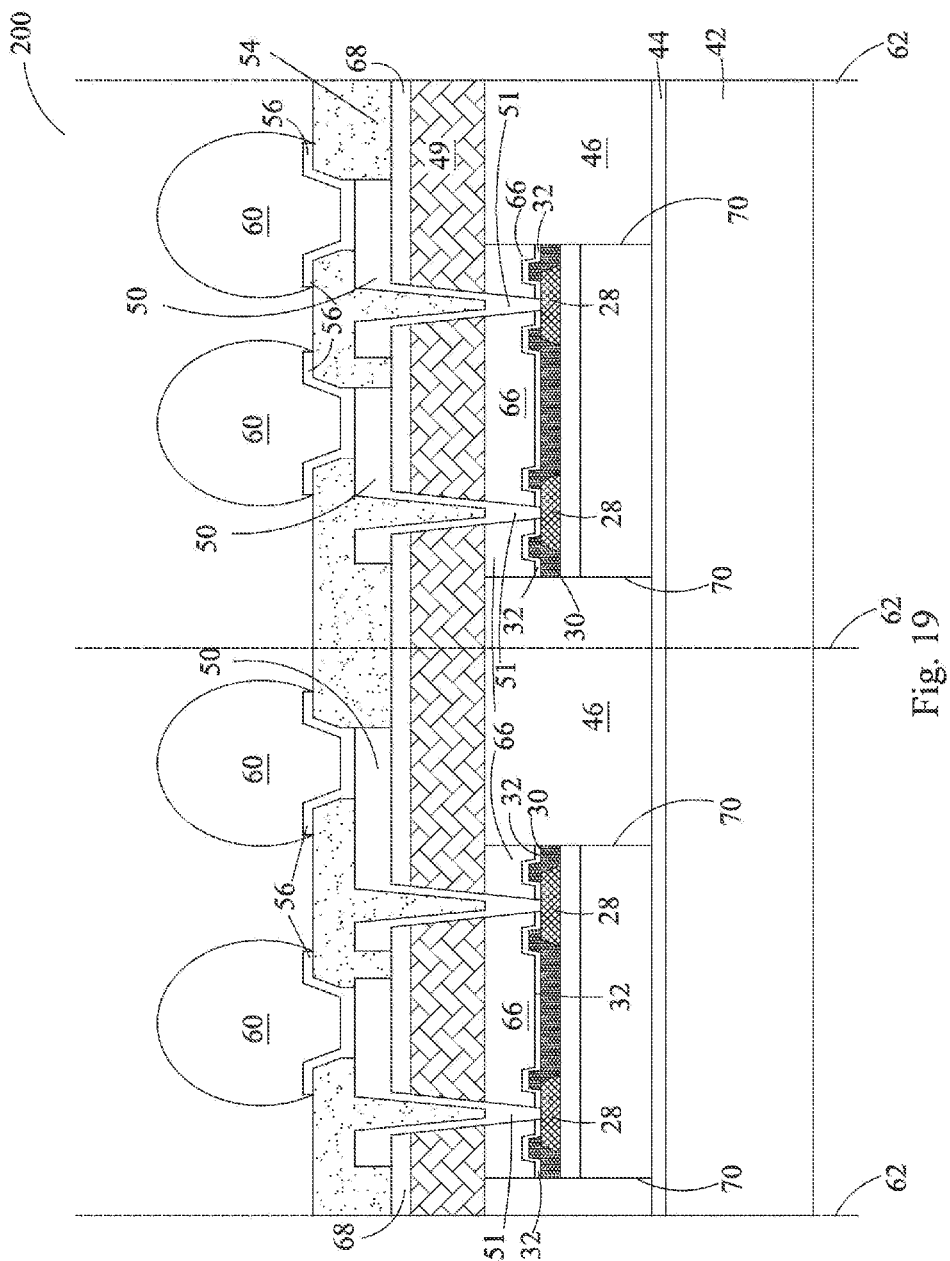

In subsequent process steps, as shown in FIGS. 18 and 19, PPIs 50, polyimide layer 54, UBMs 56, and solder balls 60 are formed. The formation steps may be essentially the same as shown in FIGS. 5 and 6. PPIs 50 include vias 51, which contact the top surfaces of metal pads 28. The resulting structure is shown in FIG. 19. The formation of fan-out wafer 200 is thus finished. Wafer 200 may then be detached from carrier 42. A die saw may be performed to saw wafer 200 into dies along scribe lines 62.

In the resulting fan-out WLP as shown in FIG. 19, dielectric layers 32 comprise portions extending to directly over, and contacting, the top surfaces of, metal pads 28. The portions of dielectric layers 32 that are directly over metal pads 28 may have edges contacting vias 51 of PPIs 50. Polyimide layers 66 are formed between polyimide layer 49 and dielectric layer 32. The side edges of polyimide layers 66, the side edges of passivation layer 30, and the side edges of dielectric layer 32 may be vertically aligned, and contacting, sidewalls 70 of molding compound 46.

In the embodiments, the dielectric layer that is formed before the sawing of device wafers may help reduce the diffusion of copper, reduce the adverse effect of out-gassing, and improve the adhesion.

In accordance with embodiments, a package includes a device die having a substrate. A molding compound contacts a sidewall of the substrate. A metal pad is over the substrate. A passivation layer has a portion covering an edge portion of the metal pad. A metal pillar is over and contacting the metal pad. A dielectric layer is over the passivation layer. A package material formed of a molding compound or a polymer is over the dielectric layer. The dielectric layer includes a bottom portion between the passivation layer and the package material, and a sidewall portion between a sidewall of the metal pillar and a sidewall of the package material. A polymer layer is over the package material, the molding compound, and the metal pillar. A PPI extends into the polymer layer. A solder ball is over the PPI, and is electrically coupled to the metal pad through the PPI.

In accordance with other embodiments, a package includes a device die comprising a substrate; and a molding compound contacting a sidewall of the substrate. A metal pad is over the substrate. A passivation layer has a portion covering an edge portion of the metal pad. A dielectric layer is over the passivation layer, wherein the dielectric layer includes a portion extending into an opening in the passivation layer. The portion of the dielectric layer has a bottom surface contacting a top surface of the metal pad. A first polymer layer is over the dielectric layer, wherein the first polymer layer does not extend to directly over the molding compound. A second polymer layer is over and vertically overlapping the first polymer layer and the molding compound. A PPI includes a via extending into an opening that extends into the first and the second polymer layers, wherein the via contacts a top surface of the metal pad, and wherein an edge of the dielectric layer contacts a sidewall of the via. A solder ball is over the PPI and the second polymer layer, wherein the solder ball is electrically coupled to the metal pad through the PPI.

In accordance with yet other embodiments, a method includes providing a device wafer, wherein the device wafer includes a device die including a substrate, a metal pad over the substrate, and a passivation layer having a portion covering an edge portion of the metal pad, wherein a center portion of a top surface of the metal pad is not covered by the passivation layer. A dielectric layer is blanket formed over the device wafer, wherein the dielectric layer is substantially conformal, and wherein an entirety of the device wafer is covered by the dielectric layer. A die saw is performed on the device wafer to separate the device die from additional dies in the wafer, wherein no patterning is performed to the dielectric layer between the step of blanket forming the dielectric layer and the step of die saw. The device die includes the dielectric layer.

In accordance with yet other embodiments, a method includes forming a dielectric layer over a device wafer. The device wafer includes a device die region having a substrate, a metal pad over the substrate, and a metal pillar over and contacting the metal pad, wherein the device die region is covered by the dielectric layer, and wherein the dielectric layer contacts a sidewall of the metal pillar. The device die region is separated from additional device die regions in the device wafer to form a device die, wherein no patterning is performed to the dielectric layer between forming the dielectric layer and separating the device die region.

In accordance with yet other embodiments, a method includes forming a first conductive feature over a first side of a substrate. A first dielectric layer is formed over the substrate and the first conductive feature. After forming the first dielectric layer, a second side of the substrate is attached to a carrier, the second side being opposite the first side. A molding compound is formed over the carrier and the substrate, the molding compound extending along a sidewall of the substrate, the first dielectric layer separating the first conductive feature from the molding compound. A first polymer layer is formed over the substrate and the molding compound. A second conductive feature is formed over the first polymer layer, at least a portion of the second conductive feature extending through the first polymer layer and being electrically coupled to the first conductive feature.

In accordance with yet other embodiments, a method includes forming a first conductive feature over a first side of a substrate. A first dielectric layer is formed over the substrate and the first conductive feature. After forming the first dielectric layer, a second side of the substrate is attached to a carrier, the second side being opposite the first side. A molding compound is formed over the carrier and the substrate, the first dielectric layer separating the first conductive feature from the molding compound. The molding compound is planarized until the first side of the substrate is free from the molding compound, a portion of the molding compound contacting a sidewall of the substrate. A first polymer layer is formed over the first conductive feature and the portion of the molding compound. A second conductive feature is formed over the first polymer layer, a portion of the second conductive feature extending through the first polymer layer and reaching at least a plane defined by a topmost surface of the portion of the molding compound, the second conductive feature being electrically coupled to the first conductive feature. A connector is formed over the second conductive feature, the second conductive feature electrically coupling the connector to the first conductive feature.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a dielectric layer over a device wafer, the device wafer comprising:
   a device die region having a substrate;
   a metal pad over the substrate; and
   a metal pillar over and contacting the metal pad, wherein the device die region is covered by the dielectric layer, and wherein the dielectric layer contacts a sidewall of the metal pillar; and
   separating the device die region from additional device die regions in the device wafer to form a device die, wherein no patterning is performed to the dielectric layer between forming the dielectric layer and separating the device die region.

2. The method of claim 1 further comprising:
   attaching the device die onto a carrier;
   forming a molding compound over the carrier, the molding compound extending along a sidewall of the device die;
   forming a first polyimide layer over the device die and the molding compound; and
   forming a post-passivation interconnect (PPI) comprising a first portion over the first polyimide layer, and a second portion extending into a first opening in the first polyimide layer and contacting the metal pillar.

3. The method of claim 2 further comprising removing a portion of the molding compound and a portion of the dielectric layer extending above a topmost surface of the metal pillar until the topmost surface of the metal pillar is exposed.

4. The method of claim 2 further comprising forming a connector over the first portion of the PPI, the PPI electrically coupling the connector to the metal pillar.

5. The method of claim 1, wherein forming the dielectric layer comprises covering an entirety of a top surface of the device wafer with the dielectric layer.

6. The method of claim 1 further comprising, before separating the device die region from the additional device die regions in the device wafer, forming a second polyimide layer over the dielectric layer.

7. The method of claim 6 further comprising removing a portion of the dielectric layer and a portion of the second polyimide layer extending above a topmost surface of the metal pillar until the topmost surface of the metal pillar is exposed.

8. A method comprising:
   forming a first conductive feature over a first side of a substrate;
   forming a first dielectric layer over the substrate and the first conductive feature;
   after forming the first dielectric layer, attaching a second side of the substrate to a carrier, the second side being opposite the first side;
   forming a molding compound over the carrier and the substrate, the molding compound extending along a sidewall of the substrate, the first dielectric layer being interposed between the first conductive feature and the molding compound;
   forming a first polymer layer over the substrate and the molding compound; and
   forming a second conductive feature over the first polymer layer, at least a portion of the second conductive feature extending through the first polymer layer and being electrically coupled to the first conductive feature.

9. The method of claim 8, wherein forming the first conductive feature comprises:
   forming a conductive pad over the first side of the substrate; and
   forming a second dielectric layer over the conductive pad, at least a portion of the conductive pad being exposed through an opening in the second dielectric layer.

10. The method of claim 9, wherein forming the first conductive feature further comprises forming a conductive pillar in the opening, the first dielectric layer extending along sidewalls and a topmost surface of the conductive pillar.

11. The method of claim 9, wherein forming the first dielectric layer comprises lining a bottom and sidewalls of the opening with the first dielectric layer, the second conductive feature extending through the first dielectric layer in the opening.

12. The method of claim 9 further comprising, before attaching the second side of the substrate to the carrier, forming a second polymer layer over the substrate, the first dielectric layer being interposed between the first conductive feature and the second polymer layer.

13. The method of claim 12, wherein at least a portion of the second polymer layer is interposed between the first conductive feature and the molding compound.

14. The method of claim 13 further comprising grinding the molding compound, the second conductive feature extending at least to a plane defined by a topmost surface of the molding compound.

15. A method comprising:
   forming a first conductive feature over a first side of a substrate;
   forming a first dielectric layer over the substrate and the first conductive feature;
   after forming the first dielectric layer, attaching a second side of the substrate to a carrier, the second side being opposite the first side;
   forming a molding compound over the carrier and the substrate, the first dielectric layer being interposed between the first conductive feature and the molding compound;
   planarizing the molding compound until the first side of the substrate is free from the molding compound, a portion of the molding compound contacting a sidewall of the substrate;
   forming a first polymer layer over the first conductive feature and the portion of the molding compound;
   forming a second conductive feature over the first polymer layer, a portion of the second conductive feature extending through the first polymer layer and reaching at least a plane defined by a topmost surface of the portion of the molding compound, the second conductive feature being electrically coupled to the first conductive feature; and
   forming a connector over the second conductive feature, the second conductive feature electrically coupling the connector to the first conductive feature.

16. The method of claim 15, wherein forming the first conductive feature comprises forming a conductive pad over the first side of the substrate, the first dielectric layer contacting at least a portion of a topmost surface of the conductive pad.

17. The method of claim 16, wherein the portion of the second conductive feature extends below the plane defined by the topmost surface of the portion of the molding compound, and wherein the portion of the second conductive feature extends through the first dielectric layer and contacts the topmost surface of the conductive pad.

18. The method of claim 17 further comprising, before attaching the second side of the substrate to the carrier, forming a second polymer layer over the first conductive feature, the portion of the second conductive feature extending through the second polymer layer.

19. The method of claim 15, wherein forming the first conductive feature comprises:
   forming a conductive pad over the first side of the substrate;
   forming a second dielectric layer over the conductive pad;
   patterning the second dielectric layer to form an opening in the second dielectric layer, the opening exposing at least a portion of the conductive pad; and
   filling the opening with a conductive material to form a conductive pillar, the first dielectric layer extending along sidewalls and a topmost surface of the conductive pillar.

20. The method of claim 19, wherein planarizing the molding compound further comprises removing a portion of the first dielectric layer over the conductive pillar.

* * * * *